(12) United States Patent
Hirabayashi

(10) Patent No.: US 7,986,547 B2
(45) Date of Patent: Jul. 26, 2011

(54) SEMICONDUCTOR MEMORY DEVICE

(75) Inventor: Osamu Hirabayashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 141 days.

(21) Appl. No.: 12/430,441

(22) Filed: Apr. 27, 2009

(65) Prior Publication Data

US 2009/0279348 A1 Nov. 12, 2009

(30) Foreign Application Priority Data

May 12, 2008 (JP) ................................. 2008-124361

(51) Int. Cl.
*G11C 11/00* (2006.01)
(52) U.S. Cl. ..................... 365/156; 365/203; 365/230.06
(58) Field of Classification Search .................. 365/156, 365/203, 230.06
See application file for complete search history.

(56) References Cited

U.S. PATENT DOCUMENTS 7,440,313 B2 * 10/2008 Abeln et al. ................... 365/154
7,630,272 B2 * 12/2009 Kenkare et al. .......... 365/230.05
7,684,264 B2 * 3/2010 Hunter et al. ............... 365/189.2
2007/0242513 A1 * 10/2007 Chang et al. ............. 365/185.07
2008/0089145 A1 * 4/2008 Luthra ...................... 365/189.14
2008/0117707 A1 * 5/2008 Manickavasakam et al. ........................ 365/230.06

OTHER PUBLICATIONS

Leland Chang, et al., "Stable SRAM Cell Design for the 32 nm Node and Beyond", 2005 Symposium on VLSI Technology Digest of Technical Papers, 2005, pp. 128-129.

* cited by examiner

*Primary Examiner* — Pho M Luu
(74) *Attorney, Agent, or Firm* — Oblon, Spivak, McClelland, Maier & Neustadt, L.L.P.

(57) ABSTRACT

A semiconductor memory device includes a memory cell array having a plurality of read word lines, a plurality of first and second read bit lines, and a plurality of memory cells arranged in array. The memory cell includes a first and a second cell node in complementary pair, a first drive transistor controlled by the second cell node, and a second drive transistor controlled by the first cell node. The read word line and the first read bit line are connected with each other via the first drive transistor. The read word line and the second read bit line are connected with each other via the second drive transistor.

19 Claims, 6 Drawing Sheets

SEMICONDUCTOR MEMORY DEVICE

CROSS-REFERENCE TO RELATED APPLICATION

This application is based upon and claims the benefit of priority from the prior Japanese Patent Application No. 2008-124361, filed on May 12, 2008, the entire contents of which are incorporated herein by reference.

BACKGROUND OF THE INVENTION

1. Field of the Invention

The present invention relates to a semiconductor memory device, and more particularly to an SRAM and so forth, which comprises memory cells of the 8-transistor type.

2. Description of the Related Art

An achievement of low power consumption in an LSI requires a low supply voltage. The lower limit of the supply voltage in the LSI is determined by an SRAM inside the LSI in many cases due to the problem of disturbance in memory cells. Namely, in a conventional memory cell of the 6-transistor type, when a word line is selected for read operation, a precharged bit line is connected to an internal node contained in a flip-flop via a transfer transistor and the internal node is slightly pulled up. Therefore, data in the flip-flop becomes unstable and a lowered supply voltage may destruct data. As a measure against such the problem of disturbance, the use of memory cells of the 8-transistor type having a read port separated is proposed (Document 1: L. Chang, et al., Symposium on VLSI Technology 2005, p 128). The memory cell of the 8-transistor type newly includes, in addition to the memory cell of the 6-transistor type, a read bit line and a read word line, a drive transistor operative to drive the read bit line, and a transfer gate transistor operative to connect the read bit line with the drive transistor. The gate of the transfer gate transistor is controlled by the read word line and the gate of the drive transistor is connected to the internal node. In this configuration, the internal node is not connected directly to the read bit line. Accordingly, the internal node is not pulled up at the time of read, and thus the problem of disturbance can be prevented. Operation at the time of write is similar to that of the memory cell of the 6-transistor type.

The SRAM comprising such the conventional memory cell of the 8-transistor type adds two transistors for drive-use and for transfer gate-use to one node in the memory cell of the 6-transistor type. Accordingly, it is required to execute single-phase, single-ended read, in the sense of preventing the increase in the number of elements. Therefore, read operation is executed with a logic circuit such as an inverter operative to decide "H" level/"L" level on the bit line. The reading speed and accuracy can be ensured by giving a rapid full swing to the bit line. Such the fast drive of the bit line requires the number of cells connected with the bit line to be reduced to around 8-32 cells and therefore extremely lowers the cell occupation ratio as a problem.

SUMMARY OF THE INVENTION

In an aspect the present invention provides a semiconductor memory device, comprising: a memory cell array including a plurality of first and second word lines, a plurality of first through fourth bit lines, and a plurality of memory cells arranged in array. The memory cell includes a flip-flop circuit containing a first inverter composed of a first NMOS transistor and a first PMOS transistor and a second inverter composed of a second NMOS transistor and a second PMOS transistor, the first inverter having an output terminal connected to the input terminal of the second inverter, the first inverter having an input terminal connected to the output terminal of the second inverter, a third NMOS transistor connected between the output terminal of the first inverter and the first bit line and having a gate connected to the first word line, a fourth NMOS transistor connected between the output terminal of the second inverter and the second bit line and having a gate connected to the first word line, a fifth NMOS transistor connected between the second word line and the third bit line and having a gate connected to the output terminal of the second inverter, and a sixth NMOS transistor connected between the second word line and the fourth bit line and having a gate connected to the output terminal of the first inverter.

In another aspect the present invention provides a semiconductor memory device, comprising: a memory cell array including a plurality of read word lines, a plurality of first and second read bit lines, and a plurality of memory cells arranged in array. The memory cell includes a flip-flop circuit containing a first inverter composed of a first NMOS transistor and a first PMOS transistor and a second inverter composed of a second NMOS transistor and a second PMOS transistor, the first inverter having an output terminal connected to the input terminal of the second inverter, the first inverter having an input terminal connected to the output terminal of the second inverter, a first drive transistor connected between the read word line and the first read bit line and having a gate connected to the output terminal of the second inverter, and a second drive transistor connected between the read word line and the first read bit line and having a gate connected to the output terminal of the first inverter.

In yet another aspect the present invention provides a semiconductor memory device, comprising: a memory cell array including a plurality of read word lines, a plurality of first and second read bit lines, and a plurality of memory cells arranged in array. The memory cell includes a first and a second cell node in complementary pair, a first drive transistor controlled by the second cell node, and a second drive transistor controlled by the first cell node. The read word line and the first read bit line are connected with each other via the first drive transistor. The read word line and the second read bit line are connected with each other via the second drive transistor.

DETAILED DESCRIPTION OF THE EMBODIMENTS

The embodiments associated with the semiconductor memory device according to the present invention will now be described in detail with reference to the drawings.

First Embodiment

Figure 1:
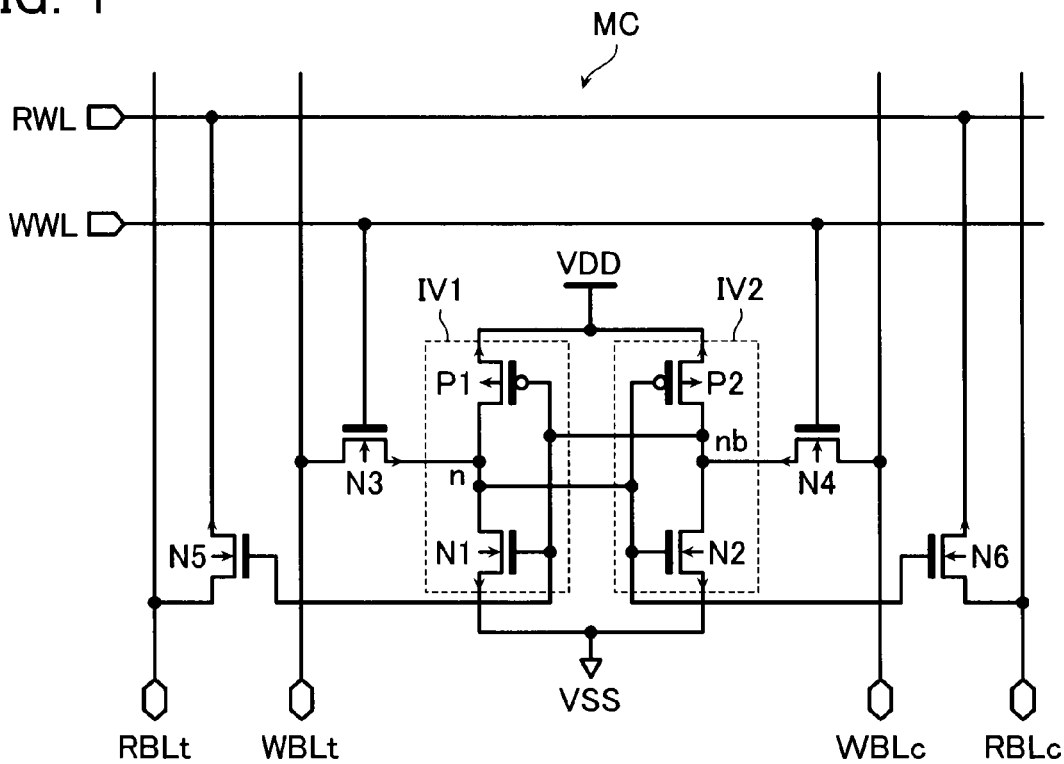
FIG. 1 is a circuit diagram of a memory cell in a semiconductor memory device according to a first embodiment of the present invention.
Figure 3:
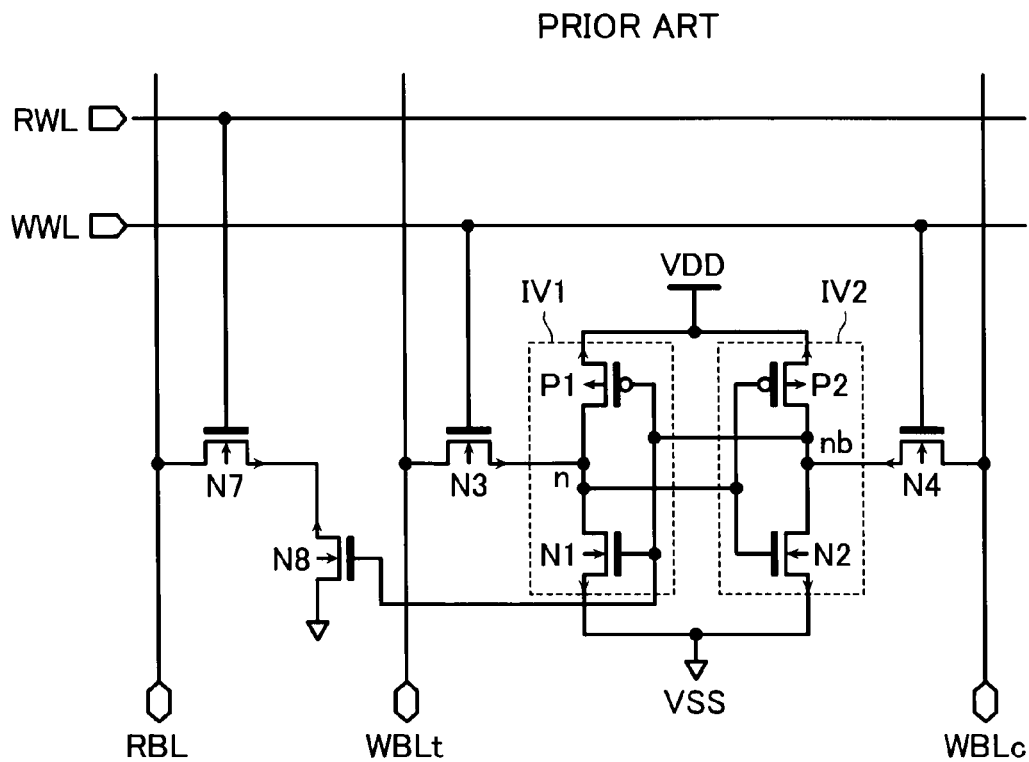
FIG. 3 is a circuit diagram of a memory cell in a semiconductor memory device associated with the prior art.

FIG. 1 is a circuit diagram of a memory cell of the 8-transistor type in a semiconductor memory device or an SRAM according to a first embodiment of the present invention. FIG. 3 shows a circuit diagram of a conventional memory cell of the 8-transistor type for comparison.

The memory cell of the 8-transistor type according to the present embodiment differs from the prior art shown in FIG. 3 in that the transfer gate transistor N7 of the prior art is omitted and only one read drive transistor (N5 or N6) is used at one node (n or nb) in the flip-flop circuit to suppress the number of elements and permit reading of the complementary pair type.

Namely, the semiconductor memory device according to the first embodiment of the present invention includes a plurality of first and second word lines or write word lines WWL and read word lines RWL, and two sets of write bit line pairs WBL and read bit line pairs RBL crossing the word lines WWL and RWL. The write bit line pairs WBL and the read bit line pairs RBL are complementary bit line pairs composed of first and second bit lines or write bit lines WBLt and WBLc and third and fourth bit lines or read bit lines RBLt and RBLc. There are plural memory cells MC connected at the intersections of the write word lines WWL and read word lines RWL and the write bit line pairs WBL and read bit line pairs RBL.

The memory cell MC includes a first inverter IV1 containing a first PMOS transistor P1 and a first NMOS transistor N1, connected in complementary pair, and having sources connected to the supply line VDD at the second potential and the ground line VSS at the first potential, respectively; and a second inverter IV2 containing a second PMOS transistor P2 and a second NMOS transistor N2, connected in complementary pair, and having sources connected to the supply line VDD and the ground line VSS, respectively. These inverters IV1, IV2 have respective inputs and outputs cross-connected. A third NMOS transistor N3 is connected between the write bit line WBLt and the output terminal of the first inverter IV1. A fourth NMOS transistor N4 is connected between the write bit line WBLc and the output terminal of the second inverter IV2. The third and fourth NMOS transistors N3, N4 have respective gates, which are connected to the write word line WWL. A fifth NMOS transistor N5 (first drive transistor) having a gate connected to the input terminal of the first inverter IV1 is connected between the read bit line RBLt and the read word line RWL. A sixth NMOS transistor N6 (second drive transistor) having a gate connected to the input terminal of the second inverter IV2 is connected between the read bit line RBLc and the read word line RWL.

Figure 2:
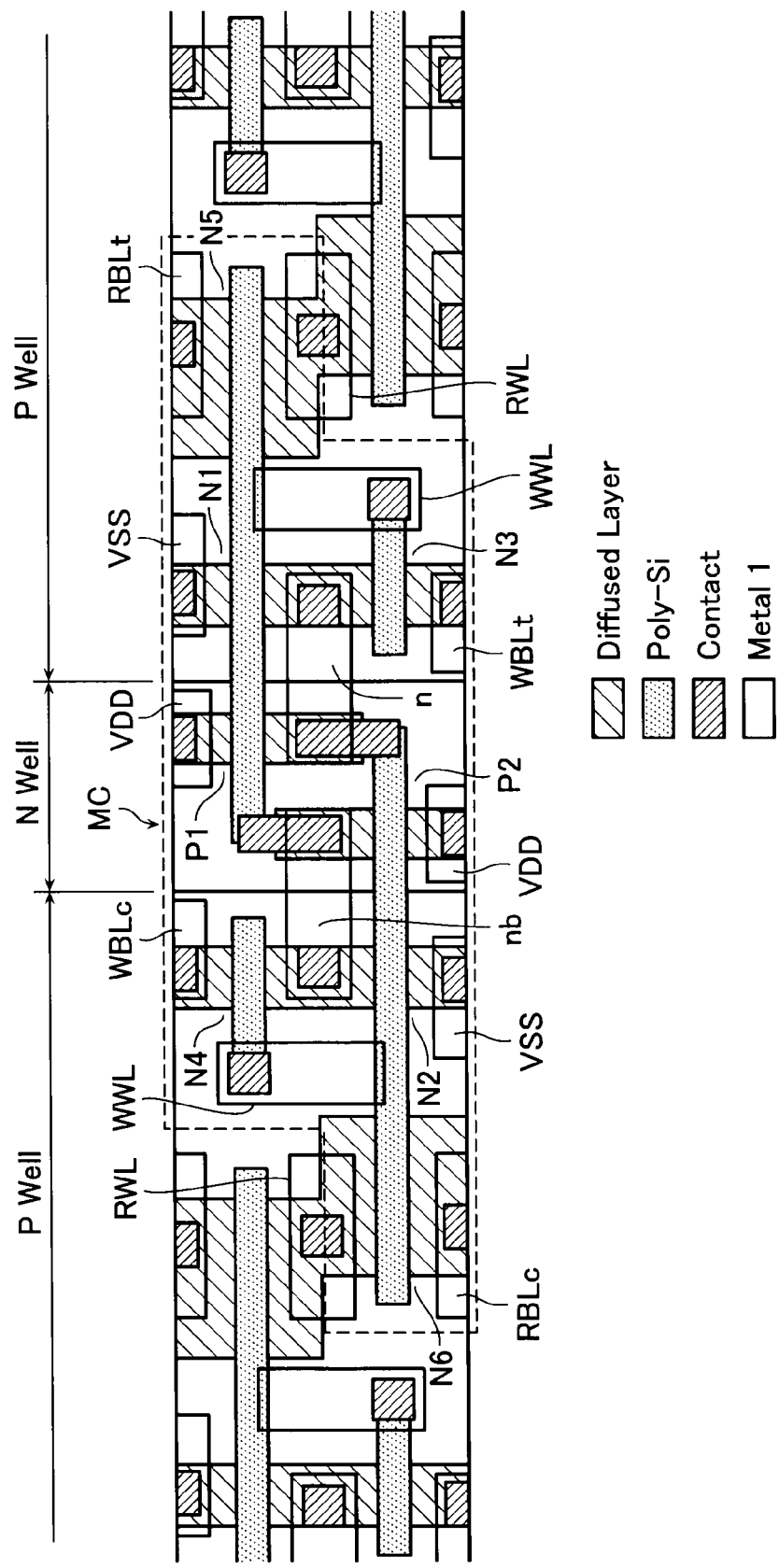
FIG. 2 shows a layout of the memory cell in the same semiconductor memory device.

FIG. 2 shows a layout of the memory cell MC shown in FIG. 1.

Figure 4:
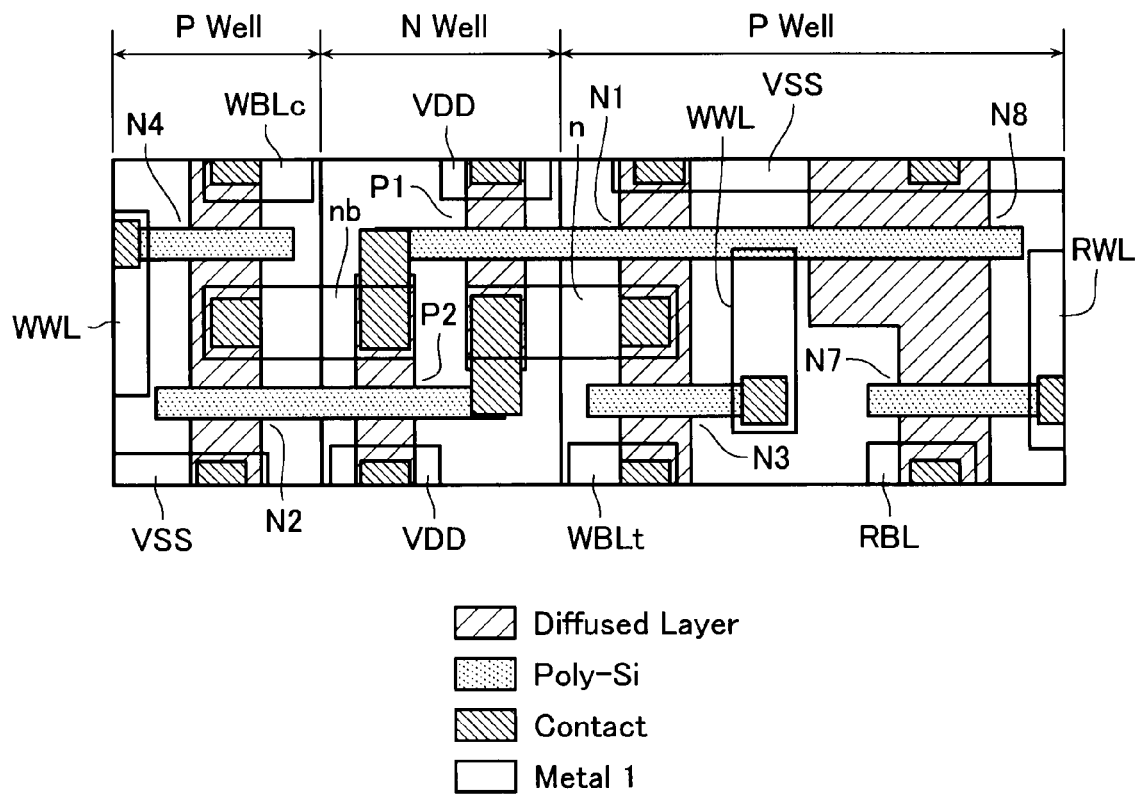
FIG. 4 shows a layout of the memory cell in the same semiconductor memory device.

A portion surrounded by the dotted line in FIG. 2 corresponds to a layout of one memory cell MC, in which memory cells MC adjoining in the column direction share contacts between the memory cells MC and the read word line RWL, and memory cells MC adjoining in the row direction share contacts between the memory cells MC and the bit lines RBLt, RBLc, WBLt and WBLc. FIG. 4 shows a layout of the memory cell of the single-ended read, 8-transistor type associated with the prior art shown in FIG. 3. As obvious from FIGS. 2 and 4, it is possible for the first and second PMOS transistors P1 and P2 and the first through fourth NMOS transistors N1-N4 to have common layouts. The prior art has an asymmetric pattern. In contrast, the present embodiment has a point-symmetric pattern and accordingly it is advantageous in easy production with easily matched characteristics.

The following description is given to operation of the semiconductor memory device according to the present embodiment.

It is assumed herein that data is read out of the memory cell MC that holds "L" on the first cell node n and "H" on the second cell node nb, and that the read word line connected to the memory cell MC is denoted with RWL, and the read bit lines with RBLt and RBLc. It is also assumed that other memory cells that share the read bit lines RBLt and RBLc are denoted with MC', and the read word line connected to the memory cell MC' with RWL'.

Figure 5:
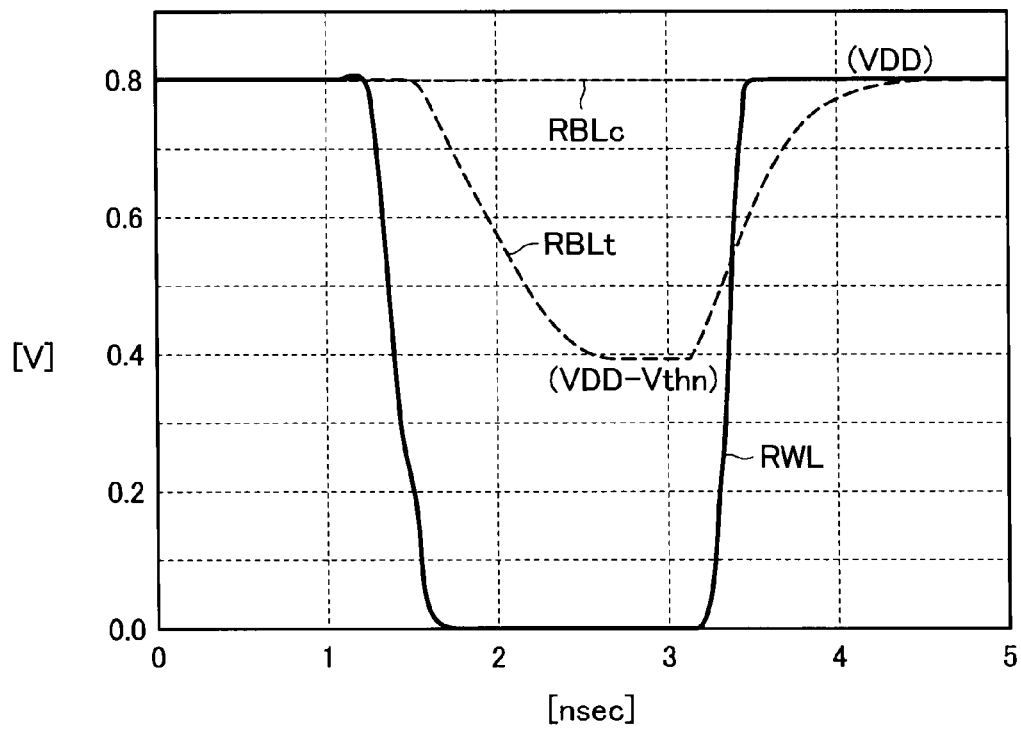
FIG. 5 is a graph showing relations between time and voltages on a read word line and a read bit line pair at the time of read in the semiconductor memory device according to the first embodiment of the present invention.

FIG. 5 shows voltages on various portions in the memory cell MC at the time of read according to the present embodiment.

The read word lines RWL and RWL' are controlled to become "H" when not selected and "L" when selected. Previously, the read bit lines RBLt and RBLc are precharged to "H".

First, when the read word line RWL is selected and becomes "L", the fifth NMOS transistor N5 in the memory cell MC is turned on because the gate-source voltage reaches or exceeds the threshold voltage Vthn, thereby starting discharge from the read bit line RBLt to the read word line RWL.

When the voltage on the read bit line RBLt lowers down to around VDD−Vthn (where Vthn denotes the threshold of an NMOS transistor), the fifth NMOS transistor N5 in a memory cell MC' having a cell node nb at "H" of plural non-selected memory cells MC' is turned on and electrically connects the read word line RWL' at "H" to the read bit line RBLt. Therefore, discharge is started from the read word line RWL' toward the read bit line RBLt, thereby clamping the level on the read bit line RBLt at around VDD−Vthn.

If cells nodes n, nb in all memory cells MC' connected to the read bit lines RBLt, RBLc are at "H", "L", discharge is not started from the read word line RWL' toward the read bit line RBLt, thereby lowering the voltage on the read bit line RBLt down to the ground potential VSS.

In either case, a potential difference equal to or higher than the threshold Vthn of the NMOS transistor arises between the read bit lines RBLt and RBLc. This potential difference is amplified at a differential sense amplifier, not shown, and read out. Available examples of the differential sense amplifier include a sense amplifier of the latch type and a sense amplifier of the current sense type, like in the prior art.

As described above, in the present embodiment, the drive NMOS transistors N5, N6 are connected between the read bit lines RBLt, RBLc and the read word line RWL, and the word line RWL is used as a discharge path, thereby omitting the transfer gate transistor N7 in the conventional circuit of FIG. 3. Accordingly, it is possible to realize a memory cell of the complementary paired 8-transistor type with the number of elements unchanged. As a result, the read bit lines RBL can be driven by a differential sense amplifier and accordingly the number of memory cells connected to the bit line can be improved to suppress the number of bit line split, thereby improving the memory cell occupation ratio.

Further, as obvious from FIG. 5, the amplitude of the read bit lines RBLt and RBLc is smaller than that in the prior art of FIG. 3. Therefore, it is possible to reduce the charge/discharge current in the read bit lines RBLt and RBLc, thereby lowering power consumption in the semiconductor memory device.

Second Embodiment

Figure 6:
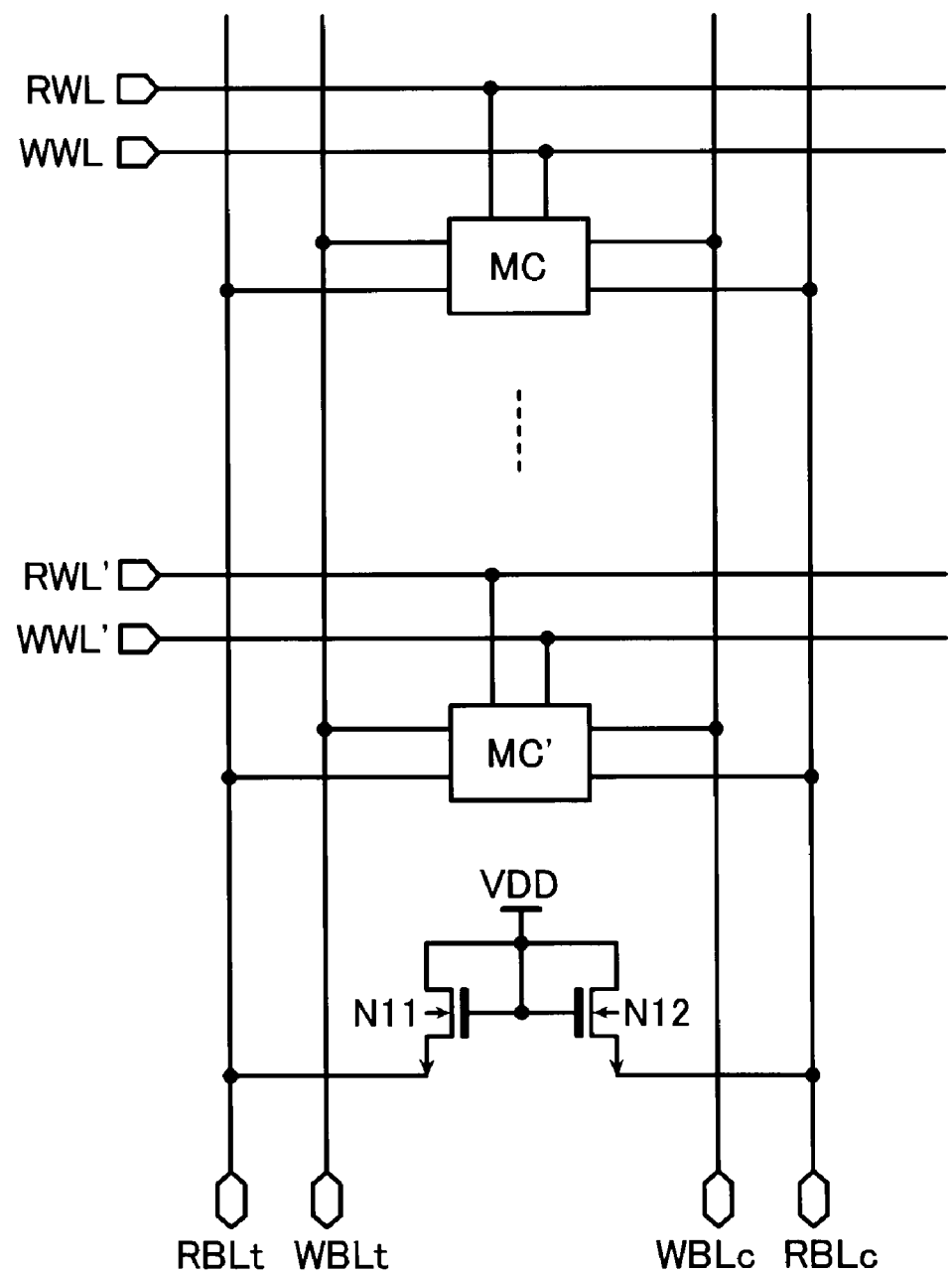
FIG. 6 shows a semiconductor memory device according to a second embodiment of the present invention.

FIG. 6 shows a semiconductor memory device according to a second embodiment of the present invention.

This semiconductor memory device comprises at least one of a first and a second bit-line clamp NMOS transistor N11 and N12, which have respective sources connected to the read bit lines RBLt and RBLc, and drains and gates connected to the supply line VDD, and which are additionally provided to the read bit lines RBLt and RBLc in the semiconductor memory device according to the first embodiment, respectively.

In the first embodiment, the state of the cell nodes n and nb in non-selected memory cells MC varies the amplitude of the read bit lines RBLt and RBLc. Therefore, it is required to adjust the lengths of time to precharge the read bit lines RBLt and RBLc.

With this regard, in the present embodiment, the bit-line clamp NMOS transistors N11, N12 are operable to adjust the amplitude of the read bit lines RBLt, RBLc to around VDD−Vthn, regardless of the state of the cell nodes n and nb in non-selected memory cells MC. Therefore, it is possible to even the lengths of time to precharge the read bit lines RBLt and RBLc.

The bit-line clamp NMOS transistors N11 and N12 may be controlled to have a threshold voltage Vthn closer to that of the fifth and sixth NMOS transistors N5 and N6, thereby further evening the amplitude of the read bit lines RBLt and RBLc. Therefore, the bit-line clamp NMOS transistors N11 and N12 are desired to have a channel implantation condition and a layout shape controlled as close to those of the fifth and sixth NMOS transistors N5 and N6 as possible.

Third Embodiment

Figure 7:
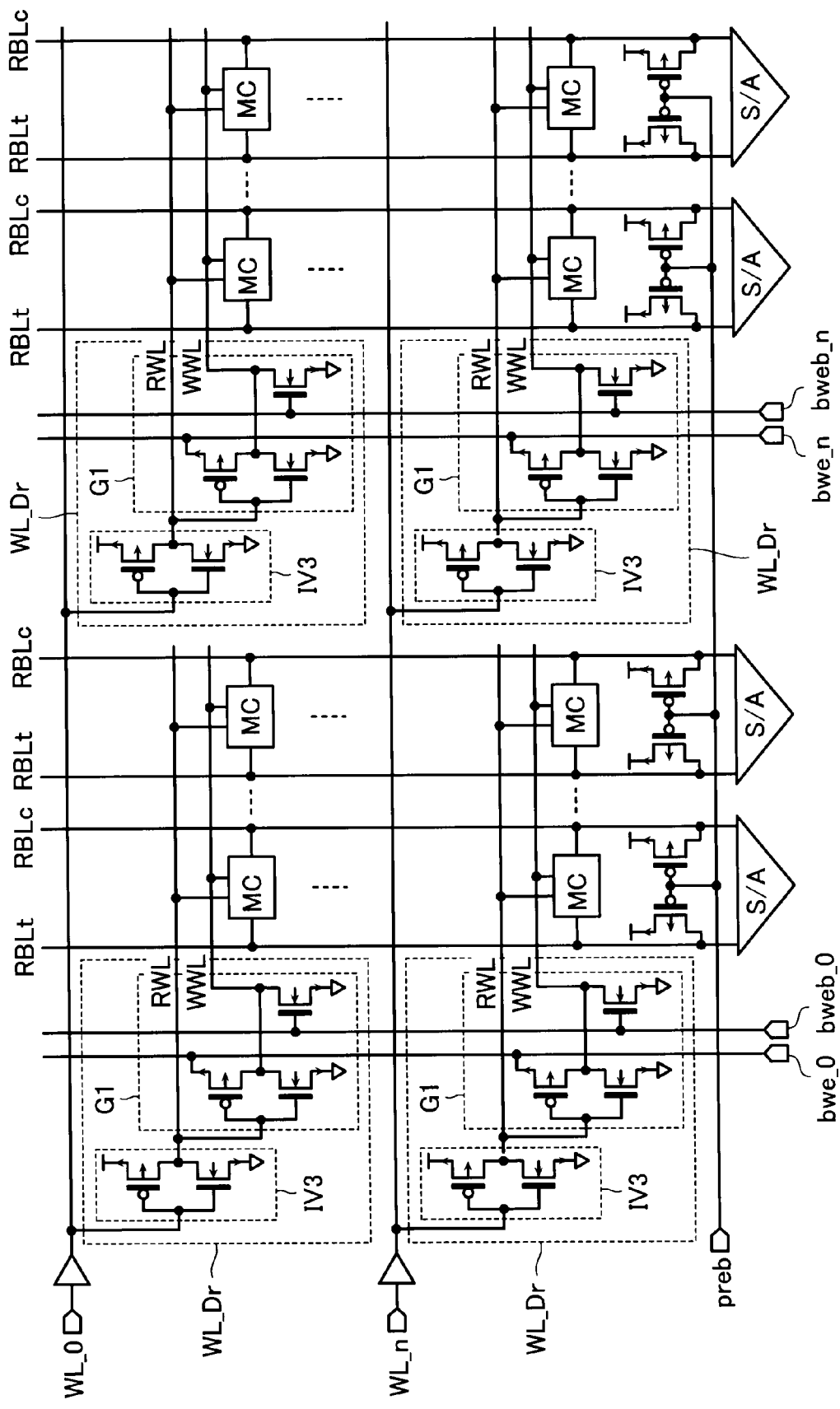
FIG. 7 is a block diagram of a read system in a semiconductor memory device according to a third embodiment of the present invention.

FIG. 7 is a block diagram of a read system in a semiconductor memory device according to a third embodiment of the present invention, from which the write bit line WBL is omitted.

The semiconductor memory device according to the present embodiment comprises a plurality of word lines WL, read word lines RWL and write word lines WWL extending in the row direction, and read bit line pairs RBL each composed of a read bit line RBLt and a read bit line RBLc. There are plural such memory cells MC as shown in FIG. 1 connected at the intersections of the read word lines RWL and write word lines WWL and the read bit line pairs RBL. One end of each read bit line pair RBL is provided with a precharge circuit controlled by a precharge signal, preb, and operative to precharge the read bit lines RBLt and RBLc up to "H", and a differential sense amplifier S/A operative to sense and amplify the potential difference between the read bit lines RBLt and RBLc. The read word line RWL and the write word line WWL are split into several. For example, in a general SRAM that executes write on a byte basis, 8 memory cells are connected to the split read word line RWL1 in one section. Between one end of the split read word line RWL and write word line WWL and the word line WL, a word line driver WL_Dr operative to drive the read word line RWL and write word line WWL is provided and controlled by positive and negative logic write control signals, bwe and bweb, shared by word line drivers WL_Dr located on the same column.

The word line driver WL_Dr includes an inverter IV3 having an input terminal connected to the word line WL and an output terminal connected to the read word line RWL, and a NOR gate operative to receive the output from the inverter IV3 and the write control signals bwe and bweb and having an output terminal connected to the write word line WWL.

The following description is given to read operation of the semiconductor memory device according to the present embodiment.

It is assumed herein that the word line WL and the write word line WWL are controlled at "L" when not selected and "H" when selected. On the other hand, the read word line RWL is controlled at "H" when not selected and "L" when selected. In addition, the write control signals bwe, bweb are controlled at "H", "L" at the time of write and "L", "H" at the time of read.

When the word line WL is selected and becomes "H", the inverter IV3 in the word line driver WL_Dr turns the read word line RWL to "L". Therefore, the sources of the NMOS transistors N5 and N6 in the memory cell MC become "L", thereby starting discharge from the read bit line RBLc or RBLt connected to the sense node n or nb held at "H" toward the read word line RWL. One word line driver WL_Dr drives only 8 memory cells MC. Accordingly, the discharge terminates with a sufficient driving force.

On the other hand, the write control signals bwe, bweb are at "L", "H" at the time of read operation. Therefore, the write word line WWL becomes "L" and keeps the NMOS transistors N3 and N4 still turned off. Accordingly, data held on the cell nodes n and nb in the memory cell MC is not susceptible to the write bit lines WBLt and WBLc.

Subsequent reading data from the memory cell MC via the differential sense amplifier S/A is similar to that in the first embodiment.

The following description is given to write operation of the semiconductor memory device according to the present embodiment.

First, when the word line WL is selected and becomes "H", the inverter IV3 in the word line driver WL_Dr turns the read word line RWL to "L".

On the other hand, the write control signals bwe, bweb are at "H", "L" for a selected byte at the time of write operation. Therefore, the write word line WWL becomes "H" and turns on the NMOS transistors N3 and N4. Thus, data on the write bit lines WBLt and WBLc flows in the cell nodes n and nb in the memory cell MC and is held thereon. For non-selected bytes, the write control signals bwe, bweb are at "L", "H". Therefore, the write word line WWL becomes "L" and keeps the NMOS transistors N3 and N4 still turned off. This prevents the problem of disturbance from occurring in non-selected bytes at the time of write.

At the time of read operation in the semiconductor memory device comprising the memory cell MC shown in FIG. 1, the word line driver WL_Dr discharges all read bit lines RBLt and RBLc via the read word line RWL. Therefore, the line resistance of the read word line RWL and the driving force of the word line driver WL_Dr exert a large influence on the reading speed.

With this regard, in the present embodiment, the word line structure split as shown in FIG. 7 makes it possible to reduce the influence by the line resistance of the read word line RWL.

Fourth Embodiment

Figure 8:
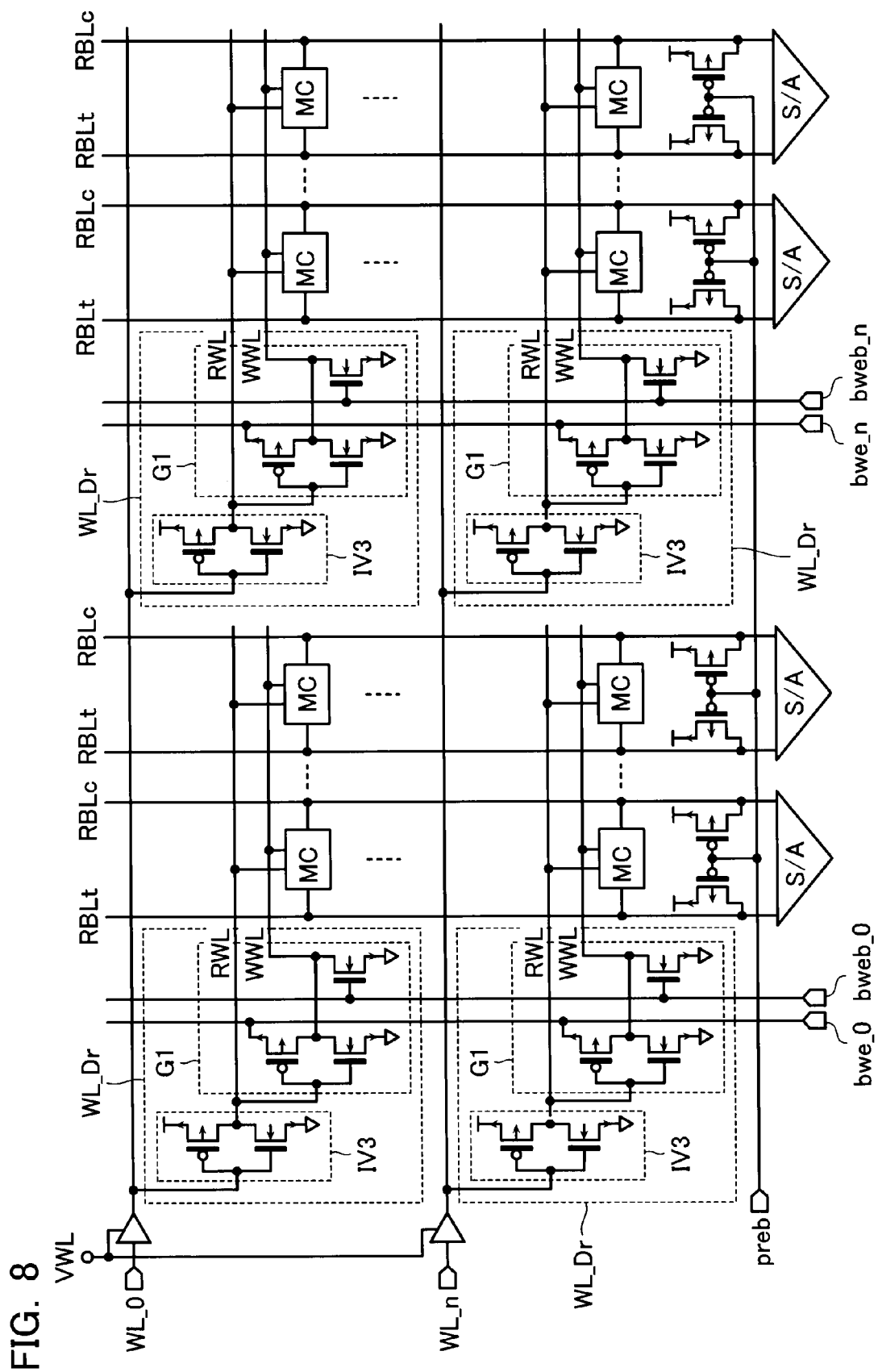
FIG. 8 is a block diagram of a read system in a semiconductor memory device according to a fourth embodiment of the present invention.

FIG. 8 is a block diagram of a read system in a semiconductor memory device according to a fourth embodiment of the present invention.

The present embodiment uses a higher voltage VWL than the supply voltage VDD as the voltage on the word line WL of the third embodiment.

A further improvement in the reading speed of the semiconductor memory device according to the third embodiment requires an improvement in the driving force of the word line driver WL_Dr. A measure against this requirement is to make larger the size of the NMOS transistor in the word line driver WL_Dr as can be considered. In this case, however, the chip area is increased inevitably.

With this regard, the present embodiment makes it possible to enhance the driving force of the word line driver WL_Dr and further improve the reading speed without causing any increase in chip area.

What is claimed is:

1. A semiconductor memory device, comprising:
a memory cell array including a plurality of first and second word lines, a plurality of first through fourth bit lines, and a plurality of memory cells arranged in array,
wherein said memory cell includes
a flip-flop circuit containing a first inverter composed of a first NMOS transistor and a first PMOS transistor and a second inverter composed of a second NMOS transistor and a second PMOS transistor, said first inverter having an output terminal connected to the input terminal of said second inverter, said first inverter having an input terminal connected to the output terminal of said second inverter,
a third NMOS transistor connected between said output terminal of said first inverter and said first bit line and having a gate connected to said first word line,
a fourth NMOS transistor connected between said output terminal of said second inverter and said second bit line and having a gate connected to said first word line,
a fifth NMOS transistor connected between said second word line and said third bit line and having a gate connected to said output terminal of said second inverter, and
a sixth NMOS transistor connected between said second word line and said fourth bit line and having a gate connected to said output terminal of said first inverter.

2. The semiconductor memory device according to claim 1, wherein said memory cell array is configured such that two of said memory cells, adjoining in the second word line direction, share a contact to said second word line, and two of said memory cells, adjoining in the third and fourth bit line direction, share contacts to said third and fourth bit lines.

3. The semiconductor memory device according to claim 1, wherein said second word line is at the ground potential when a memory cell connected thereto is selected,
said third and fourth bit lines are precharged to the supply potential prior to reading data from said memory cell.

4. The semiconductor memory device according to claim 1, further comprising a differential sense amplifier operative to receive data on said third and fourth bit lines to amplify data in said memory cell.

5. The semiconductor memory device according to claim 1, further comprising at least one of a first bit-line clamp NMOS transistor having a source connected to said third bit line and a gate and a drain connected to the supply line, and a second bit-line clamp NMOS transistor having a source connected to said fourth bit line and a gate and a drain connected to the supply line.

6. The semiconductor memory device according to claim 1, wherein said second word line is split at write units, further comprising word line drivers each for said split second word line.

7. The semiconductor memory device according to claim 6, further comprising a third word line extending in the first and second word line direction and operative to select said memory cell,
wherein said word line driver includes an inverter having an input terminal connected to said third word line and an output terminal connected to said first word line.

8. The semiconductor memory device according to claim 6, wherein said write unit includes eight memory cells of said memory cells.

9. A semiconductor memory device, comprising:
a memory cell array including a plurality of read word lines, a plurality of first and second read bit lines, and a plurality of memory cells arranged in array,
wherein said memory cell includes
a flip-flop circuit containing a first inverter composed of a first NMOS transistor and a first PMOS transistor and a second inverter composed of a second NMOS transistor and a second PMOS transistor, said first inverter having an output terminal connected to the input terminal of said second inverter, said first inverter having an input terminal connected to the output terminal of said second inverter,
a first drive transistor connected between said read word line and said first read bit line and having a gate connected to said output terminal of said second inverter, and
a second drive transistor connected between said read word line and said first read bit line and having a gate connected to said output terminal of said first inverter.

10. The semiconductor memory device according to claim 9, wherein said memory cell array is configured such that two of said memory cells, adjoining in the word line direction, share a contact to said read word line, and two of said memory cells, adjoining in the first and second read bit line direction, share contacts to said first and second read bit lines.

11. The semiconductor memory device according to claim 9, wherein said read word line is at the ground potential when a memory cell connected thereto is selected,
said first and second read bit lines are precharged to the supply potential prior to reading data from said memory cell.

12. The semiconductor memory device according to claim 9, further comprising a differential sense amplifier operative to receive data on said first and second read bit lines to amplify data in said memory cell.

13. The semiconductor memory device according to claim 9, further comprising at least one of a first bit-line clamp NMOS transistor having a source connected to said first read bit line and a gate and a drain connected to the supply line, and a second bit-line clamp NMOS transistor having a source connected to said second read bit line and a gate and a drain connected to the supply line.

14. The semiconductor memory device according to claim 9, wherein said read word line is split at write units, further comprising word line drivers each for said split read word line.

15. A semiconductor memory device, comprising:
a memory cell array including a plurality of read word lines, a plurality of first and second read bit lines, and a plurality of memory cells arranged in array,
wherein said memory cell includes
a first and a second cell node in complementary pair, a first drive transistor controlled by said second cell node, and a second drive transistor controlled by said first cell node, said read word line and said first read bit line are connected with each other via said first drive transistor, said read word line and said second read bit line are connected with each other via said second drive transistor, and said memory cell array is configured such that two of said memory cells, adjoining in the read word line direction, share a contact to said read word line, and two of said memory cells, adjoining in the first and second read bit line direction, share contacts to said first and second read bit lines, said contact to said read word line and said contacts to said first and second read bit lines being formed on boundaries of adjoining memory cells.

16. The semiconductor memory device according to claim 15, wherein said read word line is at the first potential when a memory cell connected thereto is selected, said first and second read bit lines are precharged to the second potential prior to reading data from said memory cell.

17. The semiconductor memory device according to claim 15, further comprising a differential sense amplifier operative to receive data on said first and second read bit lines to amplify data in said memory cell.

18. The semiconductor memory device according to claim 15, further comprising at least one of a first bit-line clamp transistor having a source connected to said first read bit line and a gate and a drain connected to the supply line at the first potential, and a second bit-line clamp transistor having a source connected to said second read bit line and a gate and a drain connected to the supply line at the first potential.

19. The semiconductor memory device according to claim 15, wherein said read word line is split at write units, further comprising word line drivers each for said split read word line.

* * * * *